(12) United States Patent
Chang et al.

(10) Patent No.: US 8,853,844 B2
(45) Date of Patent: Oct. 7, 2014

(54) MULTIFUNCTION SEMICONDUCTOR PACKAGE STRUCTURE AND METHOD OF MANUFACTURING THE SAME

(71) Applicant: Inpaq Technology Co., Ltd., Miaoli County (TW)

(72) Inventors: Huai-Luh Chang, New Taipei (TW); Yu-Chia Chang, Taichung (TW); Kuo-Jung Fu, Taipei (TW)

(73) Assignee: Inpaq Technology Co., Ltd., Miaoli County (TW)

( * ) Notice: Subject to any disclaimer, the term of this patent is extended or adjusted under 35 U.S.C. 154(b) by 0 days.

(21) Appl. No.: 13/761,218

(22) Filed: Feb. 7, 2013

(65) Prior Publication Data

US 2014/0217563 A1   Aug. 7, 2014

(51) Int. Cl.
*H01L 23/02*   (2006.01)
*H01L 23/62*   (2006.01)
*H01L 21/50*   (2006.01)

(52) U.S. Cl.
CPC ................ *H01L 23/62* (2013.01); *H01L 21/50* (2013.01)
USPC ........... 257/678; 257/787; 257/734; 438/106; 438/112; 333/204

(58) Field of Classification Search
USPC ........... 174/524; 257/659, 678–787; 438/112, 438/106; 333/204
See application file for complete search history.

(56) References Cited

U.S. PATENT DOCUMENTS

| | | | | |
|---|---|---|---|---|
| 6,072,122 A | * | 6/2000 | Hosoya | 174/524 |
| 6,297,551 B1 | * | 10/2001 | Dudderar et al. | 257/723 |
| 6,794,747 B2 | * | 9/2004 | Takehara et al. | 257/705 |
| 7,341,888 B2 | * | 3/2008 | Nam et al. | 438/106 |
| 2005/0184831 A1 | * | 8/2005 | Yasuda et al. | 333/204 |
| 2011/0062580 A1 | * | 3/2011 | Liu et al. | 257/737 |

* cited by examiner

Primary Examiner — Eugene Lee
Assistant Examiner — Fang-Xing Jiang
(74) Attorney, Agent, or Firm — Li & Cai Intellectual Property (USA) Office

(57) ABSTRACT

A multifunction semiconductor package structure includes a substrate unit, a circuit unit, a support unit, a semiconductor unit, a package unit and an electrode unit. The substrate unit includes a substrate body and a first electronic element having a plurality of conductive contact portions. The circuit unit includes a plurality of first conductive layers disposed on the substrate body. The semiconductor unit includes a plurality of second electronic elements. Each second electronic element is electrically connected between two corresponding first conductive layers. The package unit includes a package body disposed on the substrate body to enclose the second electronic elements. The electrode unit includes a plurality of top electrodes, a plurality of bottom electrodes, and a plurality of lateral electrodes electrically connected between the top electrodes and the bottom electrodes. Each lateral electrode is electrically connected to the corresponding first conductive layer and the corresponding conductive contact portion.

3 Claims, 5 Drawing Sheets

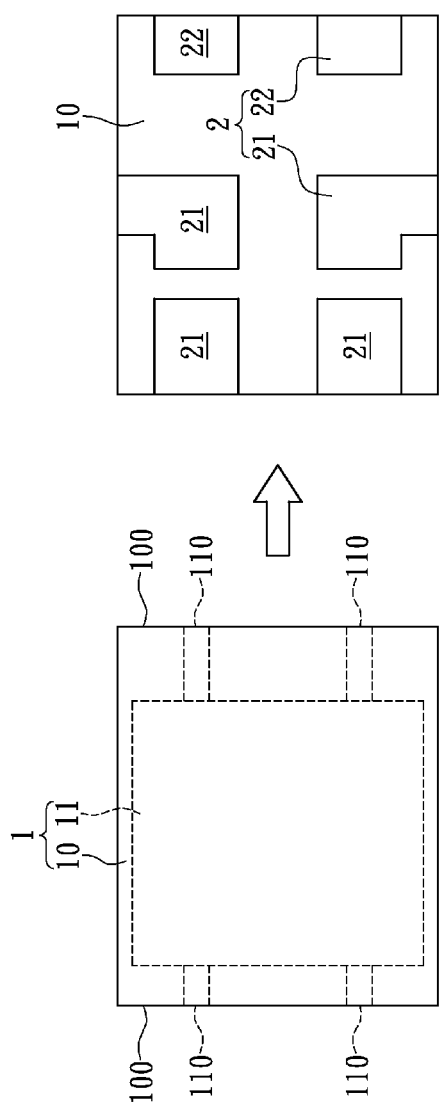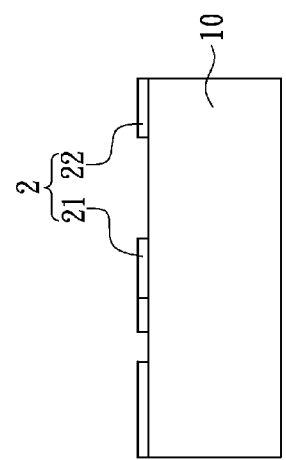
FIG. 2A
FIG. 2B

MULTIFUNCTION SEMICONDUCTOR PACKAGE STRUCTURE AND METHOD OF MANUFACTURING THE SAME

BACKGROUND OF THE INVENTION

1. Field of the Invention

The instant disclosure relates to a package structure and a method of manufacturing the same, and more particularly to a multifunction semiconductor package structure and a method of manufacturing the same.

2. Description of Related Art

Future electronic products have the requirement of being light, thin, short, and small. Moreover, the size of passive electronic components in those products is becoming larger than that of the other components. Hence, if the passive components can be effectively integrated, the electronic product can achieve the quality of being light, thin, short and small. However, each passive component only has a single function in the prior design. Hence, when a designer needs to use many different functions for protecting the electronic product, the designer only can place many passive components with a single function in the electronic product. Therefore, the method of the prior art wastes cost and occupies much space in the electronic product.

The transient voltage suppressors (TVS) are commonly applied for protecting integrated circuits from damages due to the inadvertent occurrence of an over voltage imposed onto the integrated circuit. An integrated circuit is designed to operate over a normal range of voltages. However, in situations such as electrostatic discharge (ESD), electrical fast transients and lightning, an unexpected and an uncontrollable high voltage may accidentally strike onto the circuit. The TVS devices are required to serve the protection functions to circumvent the damages that are likely to occur to the integrated circuits when such over voltage conditions occur. As increasing number of devices are implemented with the integrated circuits that are vulnerable to over voltage damages, demands for TVS protection are also increased. Exemplary applications of TVS can be found in the USB power and data line protection, digital video interface, high speed Ethernet, Notebook computers, monitors and flat panel displays.

SUMMARY OF THE INVENTION

One aspect of the instant disclosure relates to a multifunction semiconductor package structure and a method of manufacturing the same. The multifunction semiconductor package structure can be used to receive two or more electronic elements (such as active or passive elements) of different types or sizes for providing two or more electronic functions.

One of the embodiments of the instant disclosure provides a multifunction semiconductor package structure, comprising: a substrate unit, a circuit unit, a semiconductor unit, a packages unit and an electrode unit. The substrate unit includes a substrate body and a common mode filter embedded in the substrate body, wherein the substrate body has a plurality of first lateral sides, and the common mode filter has a plurality of conductive contact portions exposed from the first lateral sides of the substrate body. The circuit unit includes a plurality of first conductive layers disposed on the top side of the substrate body and a plurality of second conductive layers disposed on the top side of the substrate body. The semiconductor unit includes a plurality of transient voltage suppressors, wherein each transient voltage suppressor is electrically connected between the two corresponding first conductive layers. The packages unit includes a package body disposed on the top side of the substrate body to enclose the transient voltage suppressors, wherein the package body has a plurality of second lateral sides respectively connected to the first lateral sides, a first end of each first conductive layer and a second end of each second conductive layer are exposed from the second lateral sides of the package body. The electrode unit includes a plurality of top electrodes disposed on the top side of the package body, a plurality of bottom electrodes disposed on the bottom side of the substrate body, and a plurality of lateral electrodes electrically connected between the top electrodes and the bottom electrodes, wherein the top electrodes respectively correspond to the first conductive layers and the second conductive layers, the bottom electrodes respectively correspond to the top electrodes, and each lateral electrode is disposed on the corresponding second lateral side of the package body and the corresponding first lateral side of the substrate body to electrically connect to the first end of the corresponding first conductive layer, the second end of the corresponding second conductive layer and the corresponding conductive contact portion.

More precisely, each transient voltage suppressor is disposed on the two adjacent first conductive layers, and each transient voltage suppressor is electrically connected between the two adjacent first conductive layers. The multifunction semiconductor package structure further comprises a support unit including a plurality of support elements respectively disposed on the first conductive layers, wherein each transient voltage suppressor is disposed on the two support elements of the two corresponding first conductive layers. Each support element is a copper post, each support element has a conductive bonding layer formed on the top side thereof, and each transient voltage suppressor is disposed on the two conductive bonding layers of the two support elements of the two corresponding first layers. Each transient voltage suppressor has a first electrode and a second electrode disposed on the bottom side thereof, and the first electrode and the second electrode of each transient voltage suppressor respectively electrically contact the two conductive bonding layers of the two support elements of the two corresponding first layers.

Another one of the embodiments of the instant disclosure provides a multifunction semiconductor package structure, comprising: a substrate unit, a circuit unit, a semiconductor unit, a packages unit and an electrode unit. The substrate unit includes a substrate body and a first electronic element embedded in the substrate body, wherein the first electronic element has a plurality of conductive contact portions exposed from the substrate body. The circuit unit includes a plurality of first conductive layers disposed on the top side of the substrate body. The semiconductor unit includes a plurality of second electronic elements, wherein each second electronic element is electrically connected between the two corresponding first conductive layers. The packages unit includes a package body disposed on the top side of the substrate body to enclose the second electronic elements, wherein each first conductive layer has an end exposed from the package body. The electrode unit includes a plurality of top electrodes disposed on the top side of the package body, a plurality of bottom electrodes disposed on the bottom side of the substrate body, and a plurality of lateral electrodes electrically connected between the top electrodes and the bottom electrodes, wherein each lateral electrode is electrically connected to the end of the corresponding first conductive layer and the corresponding conductive contact portion.

Yet another one of the embodiments of the instant disclosure provides a method of manufacturing a multifunction semiconductor package structure, comprising the steps of:

providing a substrate unit including a substrate body and a common mode filter embedded in the substrate body, wherein the substrate body has a plurality of first lateral sides, and the common mode filter has a plurality of conductive contact portions exposed from the first lateral sides of the substrate body; forming a plurality of first conductive layers and a plurality of second conductive layers disposed on the top side of the substrate body, and then respectively forming a plurality of support elements on the first conductive layers, wherein each transient voltage suppressor is disposed on the two support elements of the two corresponding first conductive layers; placing a plurality of transient voltage suppressors on the first conductive layers, wherein each transient voltage suppressor is electrically connected between the two corresponding first conductive layers; forming a package body on the top side of the substrate body to enclose the transient voltage suppressors, wherein the package body has a plurality of second lateral sides respectively connected to the first lateral sides, a first end of each first conductive layer and a second end of each second conductive layer are exposed from the second lateral sides of the package body; forming a plurality of top electrodes on the top side of the package body and forming a plurality of bottom electrodes on the bottom side of the substrate body, wherein the top electrodes respectively correspond to the first conductive layers and the second conductive layers, and the bottom electrodes respectively correspond to the top electrodes; and then forming a plurality of lateral electrodes electrically connected between the top electrodes and the bottom electrodes, wherein each lateral electrode is disposed on the corresponding second lateral side of the package body and the corresponding first lateral side of the substrate body to electrically connect to the first end of the corresponding first conductive layer, the second end of the corresponding second conductive layer and the corresponding conductive contact portion.

Therefore, the common mode filter is embedded in the substrate body, each transient voltage suppressor is electrically connected between the two corresponding first conductive layers through the two corresponding support elements, and each lateral electrode is disposed on the corresponding second lateral side of the package body and the corresponding first lateral side of the substrate body to electrically connect to the first end of the corresponding first conductive layer, the second end of the corresponding second conductive layer and the corresponding conductive contact portion. Thus, the multifunction semiconductor package structure can be used to receive two or more electronic elements (such as active or passive elements) of different types or sizes for providing two or more electronic functions.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

Figure 3A:
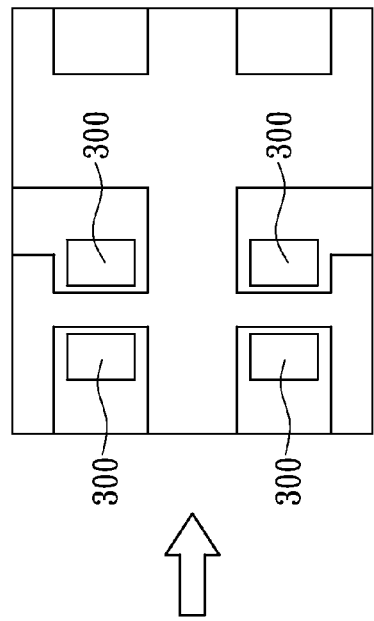
Figure 3A:
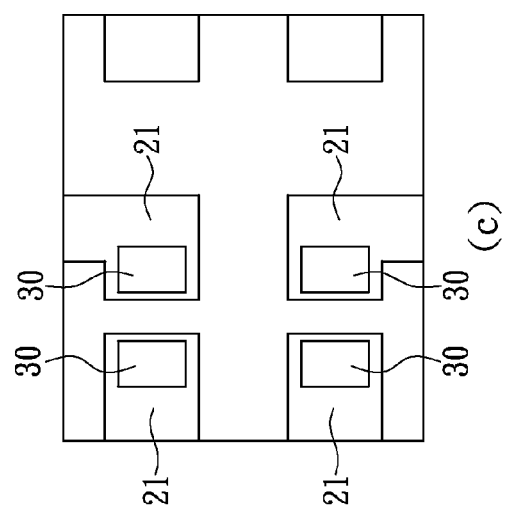
Figure 3B:
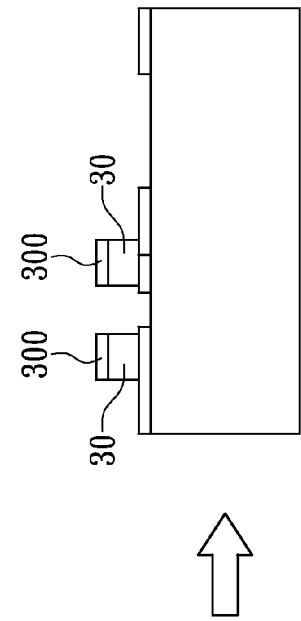
Figure 3B:
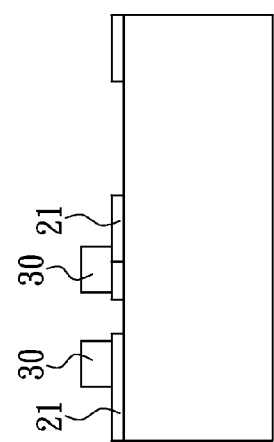
Figure 4A:
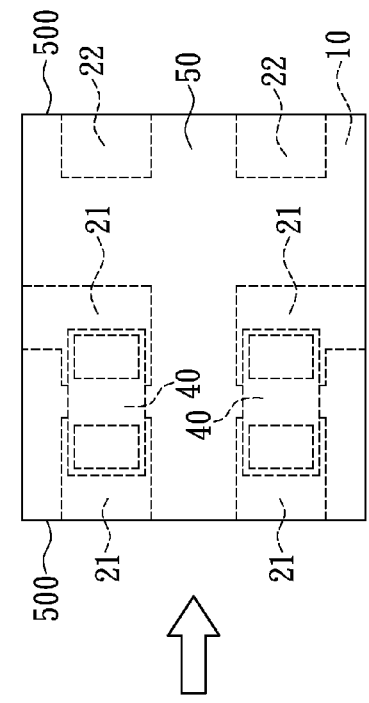
Figure 4A:
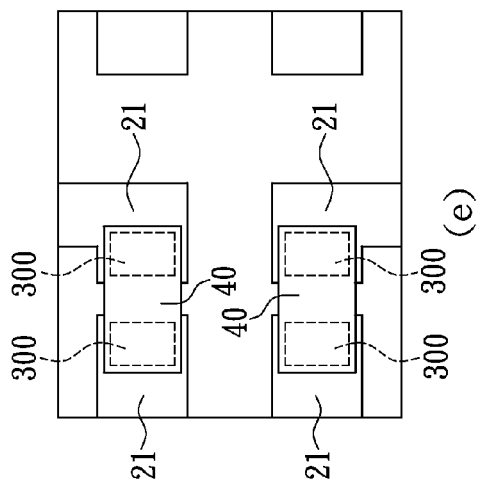
Figure 4B:
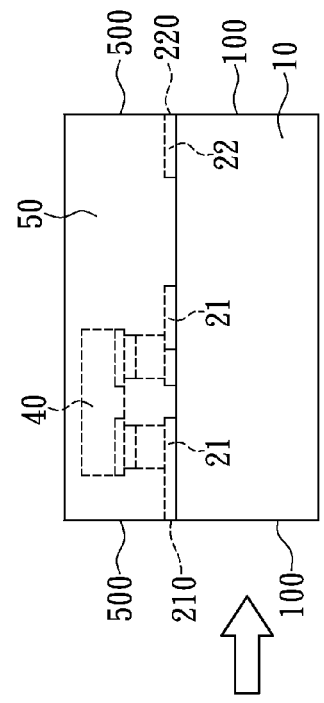
Figure 4B:
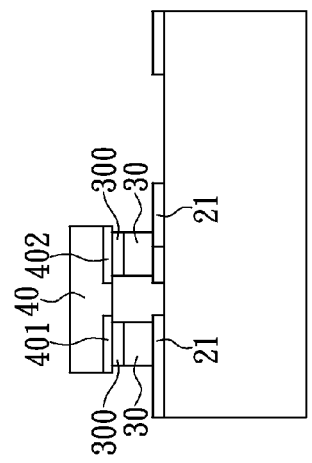
Figure 5A:
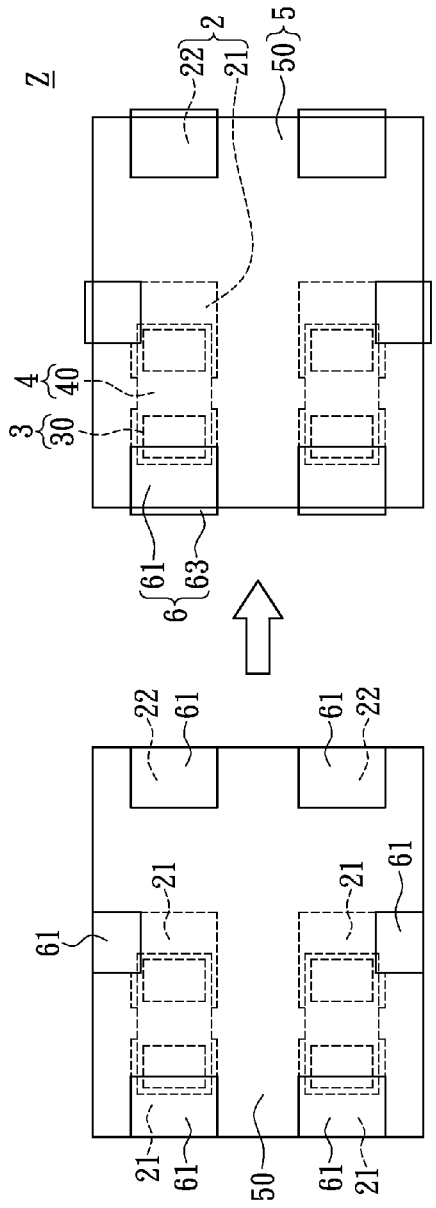
Figure 5B:
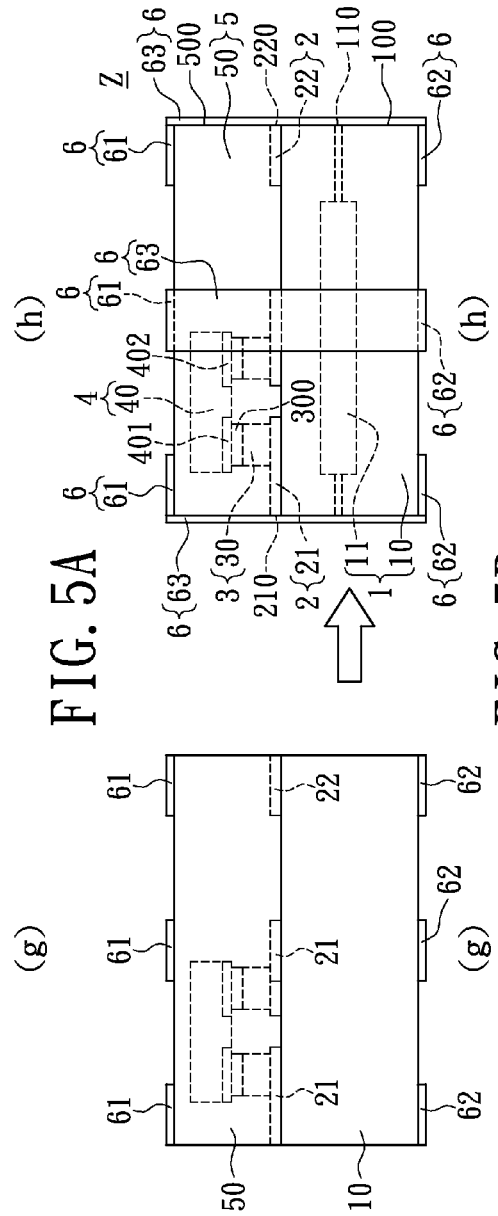

The step (a) and the step (b) of FIG. 2A respectively show two top, schematic views of the step S100 and the step S102 of the method of manufacturing a multifunction semiconductor package structure according to the instant disclosure;

The step (a) and the step (b) of FIG. 2B respectively show two lateral, schematic views of the step S100 and the step S102 of the method of manufacturing a multifunction semiconductor package structure according to the instant disclosure;

The step (c) and the step (d) of FIG. 3A respectively show two top, schematic views of the step S104 and the step S106 of the method of manufacturing a multifunction semiconductor package structure according to the instant disclosure;

The step (c) and the step (d) of FIG. 3B respectively show two lateral, schematic views of the step S104 and the step S106 of the method of manufacturing a multifunction semiconductor package structure according to the instant disclosure;

The step (e) and the step (f) of FIG. 4A respectively show two top, schematic views of the step S108 and the step S110 of the method of manufacturing a multifunction semiconductor package structure according to the instant disclosure;

The step (e) and the step (f) of FIG. 4B respectively show two lateral, schematic views of the step S108 and the step S110 of the method of manufacturing a multifunction semiconductor package structure according to the instant disclosure;

The step (g) and the step (h) of FIG. 5A respectively show two top, schematic views of the step S112 and the step S114 of the method of manufacturing a multifunction semiconductor package structure according to the instant disclosure, and the step (h) of FIG. 5A is a top, schematic diagram of the multifunction semiconductor package structure according to the instant disclosure; and The step (g) and the step (h) of FIG. 5B respectively show two lateral, schematic views of the step S112 and the step S114 of the method of manufacturing a multifunction semiconductor package structure according to the instant disclosure, and the step (h) of FIG. 5B is a lateral, schematic diagram of the multifunction semiconductor package structure according to the instant disclosure.

DETAILED DESCRIPTION OF THE PREFERRED EMBODIMENTS

Figure 1:
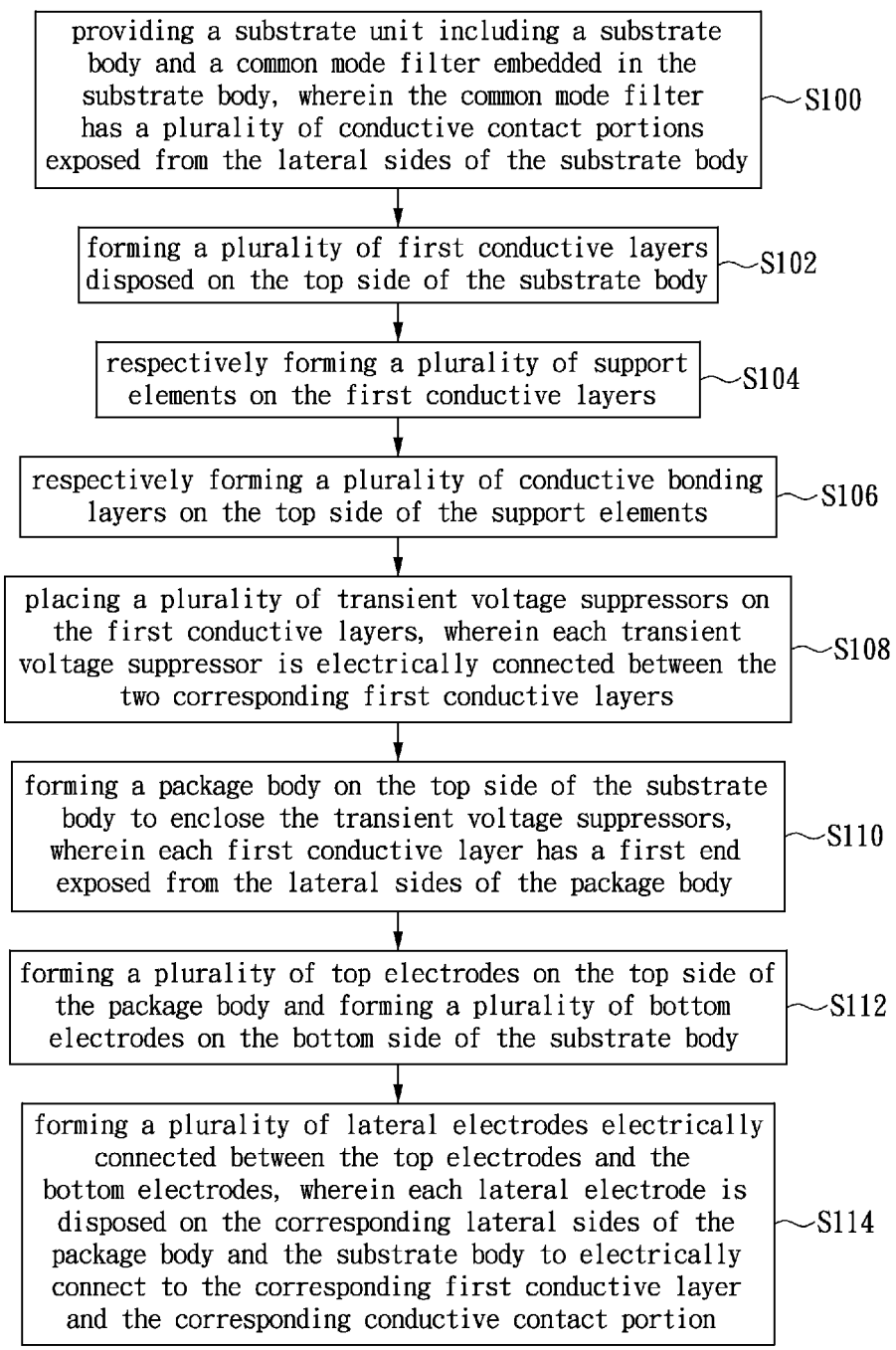
FIG. 1 shows a flowchart of the method of manufacturing a multifunction semiconductor package structure according to the instant disclosure.

Referring to FIG. 1 and FIG. 2A to FIG. 5B, where the instant disclosure provides a method of manufacturing a multifunction semiconductor package structure Z (or an electronic element package structure Z), comprising the following steps:

Referring to FIG. 1, the step (a) of FIG. 2A and the step (a) of FIG. 2B, where the step (a) of FIG. 2A shows a top, schematic view of the step S100 of the method of manufacturing the multifunction semiconductor package structure Z according to the instant disclosure, and the step (a) of FIG. 2B shows a lateral, schematic view of the step S100 of the method of manufacturing the multifunction semiconductor package structure Z according to the instant disclosure. The step S100 is that: providing a substrate unit 1 including a substrate body 10 and a common mode filter 11 embedded in the substrate body 10, wherein the substrate body 10 has a plurality of first lateral sides 100, and the common mode filter 11 has a plurality of conductive contact portions 110 exposed from the first lateral sides 100 of the substrate body 10. More precisely, because the common mode filter 11 having an anti-EMI function is embedded in the substrate body 10 in advance, the substrate body 10 having the common mode filter 11 is a module component. In addition, the first lateral sides 100 are sequentially connected with each other to form the peripheral surface of the substrate body 10, and the conductive contact portions 110 of the common mode filter 11 are exposed from the peripheral surface of the substrate body 10. For example, the instant disclosure using four conductive contact portions 110 is merely an example and is not meant to limit the instant disclosure.

Referring to FIG. 1, the step (b) of FIG. 2A and the step (b) of FIG. 2B, where the step (b) of FIG. 2A shows a top, schematic view of the step S102 of the method of manufacturing the multifunction semiconductor package structure Z according to the instant disclosure, and the step (b) of FIG. 2B shows a lateral, schematic view of the step S102 of the method of manufacturing the multifunction semiconductor package structure Z according to the instant disclosure. The step S102 is that: forming a plurality of first conductive layers 21 and a plurality of second conductive layers 22 disposed on the top side of the substrate body 10. For example, the instant disclosure using four first conductive layers 21 and two second conductive layers 22 is merely an example and is not meant to limit the instant disclosure.

Referring to FIG. 1, the step (c) of FIG. 3A and the step (c) of FIG. 3B, where the step (c) of FIG. 3A shows a top, schematic view of the step S104 of the method of manufacturing the multifunction semiconductor package structure Z according to the instant disclosure, and the step (c) of FIG. 3B shows a lateral, schematic view of the step S104 of the method of manufacturing the multifunction semiconductor package structure Z according to the instant disclosure. The step S104 is that: respectively forming a plurality of support elements 30 on the first conductive layers 21. For example, each support element 30 may be a quadrilateral copper post (or a copper pillar), and the instant disclosure using four support elements 30 is merely an example and is not meant to limit the instant disclosure.

Referring to FIG. 1, the step (d) of FIG. 3A and the step (d) of FIG. 3B, where the step (d) of FIG. 3A shows a top, schematic view of the step S106 of the method of manufacturing the multifunction semiconductor package structure Z according to the instant disclosure, and the step (d) of FIG. 3B shows a lateral, schematic view of the step S106 of the method of manufacturing the multifunction semiconductor package structure Z according to the instant disclosure. The step S106 is that: respectively forming a plurality of conductive bonding layers 300 on the top side of the support elements 30. For example, each conductive bonding layer 300 may be a Ni/Sn layer, and the instant disclosure using four conductive bonding layers 300 is merely an example and is not meant to limit the instant disclosure.

Referring to FIG. 1, the step (e) of FIG. 4A and the step (e) of FIG. 4B, where the step (e) of FIG. 4A shows a top, schematic view of the step S108 of the method of manufacturing the multifunction semiconductor package structure Z according to the instant disclosure, and the step (e) of FIG. 4B shows a lateral, schematic view of the step S108 of the method of manufacturing the multifunction semiconductor package structure Z according to the instant disclosure. The step S108 is that: placing a plurality of transient voltage suppressors 40 (i.e., TVS diodes) on the first conductive layers 21, wherein each transient voltage suppressor 40 is electrically connected between the two corresponding first conductive layers 21. More precisely, each transient voltage suppressor 40 can be disposed on the two support elements 30 of the two corresponding first conductive layers 21. Because each conductive bonding layer 300 is formed on the top side of the corresponding support element 30, each transient voltage suppressor 40 can be disposed on the two conductive bonding layers 300 of the two support elements 30 of the two corresponding first layers 21 by reflow soldering. More precisely, each transient voltage suppressor 40 has a first electrode 401 and a second electrode 402 disposed on the bottom side thereof, and the first electrode 401 and the second electrode 402 of each transient voltage suppressor 40 can respectively electrically contact the two conductive bonding layers 300 of the two support elements 30 of the two corresponding first layers 21. For example, the instant disclosure using two transient voltage suppressors 40 is merely an example and is not meant to limit the instant disclosure.

Referring to FIG. 1, the step (f) of FIG. 4A and the step (f) of FIG. 4B, where the step (f) of FIG. 4A shows a top, schematic view of the step S110 of the method of manufacturing the multifunction semiconductor package structure Z according to the instant disclosure, and the step (f) of FIG. 4B shows a lateral, schematic view of the step S110 of the method of manufacturing the multifunction semiconductor package structure Z according to the instant disclosure. The step S110 is that: forming a package body 50 on the top side of the substrate body 10 to enclose or cover the transient voltage suppressors 40, wherein the package body 50 has a plurality of second lateral sides 500 respectively connected to the first lateral sides 100, a first end 210 of each first conductive layer 21 and a second end 220 of each second conductive layer 22 are exposed from the second lateral sides 500 of the package body 50. For example, the package body 50 may be an opaque package resin body, and the package body 50 can be formed on the top side of the substrate body 10 by printing or molding, but it is merely an example and is not meant to limit the instant disclosure.

Referring to FIG. 1, the step (g) of FIG. 5A and the step (g) of FIG. 5B, where the step (g) of FIG. 5A shows a top, schematic view of the step S112 of the method of manufacturing the multifunction semiconductor package structure Z according to the instant disclosure, and the step (g) of FIG. 5B shows a lateral, schematic view of the step S112 of the method of manufacturing the multifunction semiconductor package structure Z according to the instant disclosure. The step S112 is that: forming a plurality of top electrodes 61 on the top side of the package body 50 and forming a plurality of bottom electrodes 62 on the bottom side of the substrate body 10, wherein the top electrodes 61 respectively correspond to the first conductive layers 21 and the second conductive layers 22, and the bottom electrodes 62 respectively correspond to the top electrodes 61. For example, the instant disclosure using six top electrodes 61 and six bottom electrodes 62 is merely an example and is not meant to limit the instant disclosure.

Referring to FIG. 1, the step (h) of FIG. 5A and the step (h) of FIG. 5B, the step (h) of FIG. 5A shows a top, schematic view of the step S114 of the method of manufacturing the multifunction semiconductor package structure Z according to the instant disclosure, and the step (h) of FIG. 5B shows a lateral, schematic view of the step S114 of the method of manufacturing the multifunction semiconductor package structure Z according to the instant disclosure. The step S114 is that: forming a plurality of lateral electrodes 63 electrically connected between the top electrodes 61 and the bottom electrodes 62, wherein each lateral electrode 63 is disposed on the corresponding second lateral side 500 of the package body 50 and the corresponding first lateral side 100 of the substrate body 10 to electrically connect to the first end 210 of the corresponding first conductive layer 21, the second end 220 of the corresponding second conductive layer 22 and the corresponding conductive contact portion 110.

More precisely, the method disclosed by the instant disclosure not only can manufacture a single multifunction semiconductor package structure Z, but also can manufacture a plurality of multifunction semiconductor package structures Z arranged as a matrix shape, according to different requirements.

Hence, referring to the step (h) of FIG. 5A and the step (h) of FIG. 5B, the instant disclosure can provide a multifunction semiconductor package structure Z through the steps from S100 to S114, comprising: a substrate unit 1, a circuit unit 2, a semiconductor unit 4, a packages unit 5 and an electrode unit 6.

The substrate unit 1 includes a substrate body 10 and a common mode filter 11 (i.e., a first electronic element) embedded in the substrate body 10. The substrate body 10 has a plurality of first lateral sides 100, and the common mode filter 11 has a plurality of conductive contact portions 110 exposed from the first lateral sides 100 of the substrate body 10. The circuit unit 2 includes a plurality of first conductive layers 21 disposed on the top side of the substrate body 10 and a plurality of second conductive layers 22 disposed on the top side of the substrate body 10. The semiconductor unit 4 includes a plurality of transient voltage suppressors 40 (i.e., second electronic element), and each transient voltage suppressor 40 is electrically connected between the two corresponding first conductive layers 21. More precisely, each transient voltage suppressor 40 is disposed on the two adjacent first conductive layers 21, and each transient voltage suppressor 40 is electrically connected between the two adjacent first conductive layers 21. The packages unit 5 including a package body 50 disposed on the top side of the substrate body 10 to enclose or cover the transient voltage suppressors 40. The package body 50 has a plurality of second lateral sides 500 respectively connected to the first lateral sides 100, a first end 210 of each first conductive layer 21 and a second end 220 of each second conductive layer 22 are exposed from the second lateral sides 500 of the package body 50. The electrode unit 6 includes a plurality of top electrodes 61 disposed on the top side of the package body 50, a plurality of bottom electrodes 62 disposed on the bottom side of the substrate body 10, and a plurality of lateral electrodes 63 electrically connected between the top electrodes 61 and the bottom electrodes 62. The top electrodes 61 respectively correspond to the first conductive layers 21 and the second conductive layers 22, the bottom electrodes 62 respectively correspond to the top electrodes 61, and each lateral electrode 63 is disposed on the corresponding second lateral side 500 of the package body 50 and the corresponding first lateral side 100 of the substrate body 10 to electrically connect to the first end 210 of the corresponding first conductive layer 21, the second end 220 of the corresponding second conductive layer 22 and the corresponding conductive contact portion 110.

Furthermore, the multifunction semiconductor package structure Z further comprises: a support unit 3 including a plurality of support elements 30 respectively disposed on the first conductive layers 21, and each transient voltage suppressor 40 is disposed on the two corresponding support elements 30 that are respectively disposed on the two corresponding first conductive layers 21. For example, each support element 30 may be a copper post, each support element 30 has a conductive bonding layer 300 formed on the top side thereof, and each transient voltage suppressor 40 is disposed on the two conductive bonding layers 300 of the two support elements 30 that are respectively disposed on the two corresponding first layers 21. In addition, each transient voltage suppressor 40 has a first electrode 401 and a second electrode 402 disposed on the bottom side thereof, and the first electrode 401 and the second electrode 402 of each transient voltage suppressor 40 can respectively electrically contact the two conductive bonding layers 300 of the two support elements 30 that are respectively disposed on the two corresponding first layers 21.

In conclusion, the common mode filter 11 can be embedded in the substrate body 10, each transient voltage suppressor 40 can be electrically connected between the two corresponding first conductive layers 21 through the two corresponding support elements 30, and each lateral electrode 63 can be disposed on the corresponding second lateral side 500 of the package body 50 and the corresponding first lateral side 100 of the substrate body 10 to electrically connect to the first end 210 of the corresponding first conductive layer 21, the second end 220 of the corresponding second conductive layer 22 and the corresponding conductive contact portion 110. Thus, the multifunction semiconductor package structure Z of the instant disclosure can be used to receive two or more electronic elements (such as active or passive elements) of different types or sizes for providing two or more electronic functions. Hence, the instant disclosure not only can decrease the package volume, the manufacturing cost and the manufacturing time and can increase the electric current transmission velocity, but also there is no any wire bonding structure in the instant disclosure to generate high frequency resonant in order to increase the resolution of the high frequency signals.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A multifunction semiconductor package structure, comprising:
 a substrate unit including a substrate body and a common mode filter, wherein the common mode filter is embedded in the substrate body in advance to form a single module component, the substrate body has a plurality of first lateral sides, and the common mode filter has a plurality of conductive contact portions exposed from the first lateral sides of the substrate body;
 a circuit unit including a plurality of first conductive layers disposed on the top side of the substrate body and a plurality of second conductive layers disposed on the top side of the substrate body;
 a support unit including a plurality of single support elements respectively disposed on the first conductive layers, wherein each single support element has a plane bottom surface directly contacting the corresponding first conductive layer;
 a semiconductor unit including a plurality of transient voltage suppressors, wherein each transient voltage suppressor is electrically connected between the two corresponding first conductive layers through two corresponding single support elements, each transient voltage suppressor is disposed on the two corresponding single support elements by reflow soldering, and each transient voltage suppressor is supported by the two corresponding single support elements for separating each transient voltage suppressor from the common mode filter by a predetermined distance and preventing the transient voltage suppressors from being interfered with the common mode filter;
 a packages unit including a package body disposed on the top side of the substrate body to enclose the transient voltage suppressors by printing, wherein the package body has a plurality of second lateral sides respectively connected to the first lateral sides, a first end of each first conductive layer and a second end of each second conductive layer are exposed from the second lateral sides of the package body; and an electrode unit including a plurality of top electrodes disposed on the top side of the package body, a plurality of bottom electrodes disposed on the bottom side of the substrate body, and a plurality of lateral electrodes electrically connected between the top electrodes and the bottom electrodes, wherein the top electrodes respectively correspond to the first conductive layers and the second conductive layers, the bottom electrodes respectively correspond to the top electrodes, and each lateral electrode is disposed on the corresponding second lateral side of the package body and the corresponding first lateral side of the substrate body to electrically connect to the first end of the corresponding first conductive layer, the second end of the corresponding second conductive layer and the corresponding conductive contact portion.

2. The multifunction semiconductor package structure of claim 1, wherein each transient voltage suppressor is disposed on the two adjacent first conductive layers, and each transient voltage suppressor is electrically connected between the two adjacent first conductive layers.

3. A method of manufacturing a multifunction semiconductor package structure, comprising:
providing a substrate unit including a substrate body and a common mode filter, wherein the common mode filter is embedded in the substrate body in advance to form a single module component, the substrate body has a plurality of first lateral sides, and the common mode filter has a plurality of conductive contact portions exposed from the first lateral sides of the substrate body;

forming a plurality of first conductive layers and a plurality of second conductive layers disposed on the top side of the substrate body;

respectively forming a plurality of support elements on the first conductive layers, wherein each support element has a plane bottom surface directly contacting the corresponding first conductive layer;

providing a plurality of transient voltage suppressors, wherein each transient voltage suppressor is electrically connected between the two corresponding first conductive layers through two corresponding single support elements, each transient voltage suppressor is disposed on the two corresponding single support elements by reflow soldering, and each transient voltage suppressor is supported by the two corresponding single support elements for separating each transient voltage suppressor from the common mode filter by a predetermined distance and preventing the transient voltage suppressors from being interfered with the common mode filter;

forming a package body on the top side of the substrate body to enclose the transient voltage suppressors by printing, wherein the package body has a plurality of second lateral sides respectively connected to the first lateral sides, a first end of each first conductive layer and a second end of each second conductive layer are exposed from the second lateral sides of the package body;

forming a plurality of top electrodes on the top side of the package body and forming a plurality of bottom electrodes on the bottom side of the substrate body, wherein the top electrodes respectively correspond to the first conductive layers and the second conductive layers, and the bottom electrodes respectively correspond to the top electrodes; and forming a plurality of lateral electrodes electrically connected between the top electrodes and the bottom electrodes, wherein each lateral electrode is disposed on the corresponding second lateral side of the package body and the corresponding first lateral side of the substrate body to electrically connect to the first end of the corresponding first conductive layer, the second end of the corresponding second conductive layer and the corresponding conductive contact portion.

* * * * *